United States Patent
Pascucci

(10) Patent No.: US 7,031,189 B2
(45) Date of Patent: Apr. 18, 2006

(54) NON-VOLATILE LATCH CIRCUIT

(75) Inventor: Luigi Pascucci, Sesto San Giovanni (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 10/434,395

(22) Filed: May 7, 2003

(65) Prior Publication Data

US 2004/0008539 A1 Jan. 15, 2004

(30) Foreign Application Priority Data

May 10, 2002 (IT) .......................... MI2002A0984

(51) Int. Cl.
*G11C 14/00* (2006.01)
(52) U.S. Cl. ...................... 365/185.08; 365/185.07; 365/185.09; 365/185.28; 365/185.03
(58) Field of Classification Search ........... 365/185.07, 365/185.08, 185.09, 185.28, 185.26, 185.03
See application file for complete search history.

(56) References Cited

U.S. PATENT DOCUMENTS

| | | | | |
|---|---|---|---|---|
| 4,400,799 A * | 8/1983 | Gudger | .................. | 365/185.08 |
| 5,615,159 A * | 3/1997 | Roohparvar | ........... | 365/185.07 |
| 5,864,499 A * | 1/1999 | Roohparvar et al. | ... | 365/185.08 |
| 6,097,629 A * | 8/2000 | Dietrich et al. | ........ | 365/185.07 |
| 6,222,765 B1 * | 4/2001 | Nojima | .................. | 365/185.08 |
| 6,469,930 B1 * | 10/2002 | Murray | .................. | 365/185.08 |
| 6,532,169 B1 * | 3/2003 | Mann et al. | ........... | 365/185.08 |

* cited by examiner

*Primary Examiner*—Andrew Q. Tran
(74) *Attorney, Agent, or Firm*—Lisa Jorgenson; J. Mark Han; Graybeal Jackson Haley LLP

(57) ABSTRACT

A memory cell includes a volatile circuit operable to store first data, and a nonvolatile circuit coupled to the volatile circuit and operable to store second data. The volatile circuit is operable to program the nonvolatile circuit with the first data, and the nonvolatile circuit is operable to program the volatile circuit with the second data.

23 Claims, 8 Drawing Sheets

US 7,031,189 B2

NON-VOLATILE LATCH CIRCUIT

PRIORITY

This application claims priority from Italian patent application No. MI2002A000984, filed May 10, 2002, which is incorporated herein by reference.

TECHNICAL FIELD

The present invention generally relates to the field of integrated circuits. More specifically, the invention concerns a non-volatile latch circuit, i.e., a circuit combining the capability, typical of a latch, of storing binary information in volatile way, with the capability, typical of a non-volatile memory element, of retaining the stored information even in absence of power supply.

BACKGROUND OF THE INVENTION

In integrated circuits, it is often necessary to provide registers capable of storing binary information in non-volatile way.

For example, in memory integrated circuits, redundancy circuits normally provide for allowing the functional replacement of memory locations that, for different reasons, are detected as defective, with redundancy locations. The redundancy circuits include registers, referred to as redundancy registers, capable of storing addresses corresponding to the defective memory locations, in operation, the addresses of the defective memory locations are compared to the current address so as to determine whether the requested access is to be diverted to a redundancy location. As known, the check of the existence of defective memory locations is performed in the integrated circuit testing phase, and the addresses corresponding to the defective locations have to be stored in non-volatile way, so that the indication of such addresses is not lost when the integrated circuit is not powered.

Non-volatile registers are also employed within control circuits for controlling configurable circuit structures, such as voltage or current dividers or arrays of switches, for storing the selected configuration of such circuit structures.

The non-volatility of the information in absence of power supply is achieved by providing an electrically programmable, non-volatile, storage element of the type used for realizing EPROMs or flash memories. Such an electrically programmable, non-volatile, storage element consists of a MOS transistor with a floating gate in which electrons can be injected for modifying the transistor threshold voltage. A programming circuit associated with the non-volatile storage element allows programming the desired information thereinto.

Moreover, by associating a latch circuit with the non-volatile storage element, and performing a single read operation of the non-volatile storage element, the information is loaded into the latch, and the loaded information is retained in the latch without any current consumption as long as the necessary voltage supply is ensured.

Recently, devices have been proposed that are capable of storing in a non-volatile way two bits of information in two separate locations of a MOS transistor. Instead of a floating gate, these devices have a layer of silicon nitride capable of trapping the electrons. As known, these devices have electric terminals that alternatively act as a drain or as a source, depending on the operation mode (read and erase or program).

It is probable that these non-volatile storage devices will be used in place of the traditional floating-gate MOS transistors to realize non-volatile latch circuits. This will probably occur not only for exploiting the capability of storing two bits instead of only one, but also for reasons of manufacturing process compatibility when the non-volatile latches have to be integrated in a circuit in which the realization of silicon-nitride non-volatile storage devices is contemplated.

SUMMARY OF THE INVENTION

In view of the state of the art described, an embodiment of the present invention provides a non-volatile latch circuit that is adapted to be used as a non-volatile storage element of both the conventional floating-gate MOS transistors and the most recent two-bits devices in which there is an inversion of function of drain and source of two electrical terminals thereof in the read and erase operations compared to the program operation.

In summary, this embodiment of the non-volatile latch circuit includes a first volatile information-storage element, a second non-volatile information-storage element electrically programmable and associated with the first information-storage element, and first circuit means activatable for operatively coupling the second information-storage element to the first information-storage element, the first circuit means being activated for loading an information stored in the second information-storage element into the first information-storage element.

This embodiment of the non-volatile latch circuit further includes second circuit means, associated with the first information-storage element, for setting the first element in a selected state, and third circuit means, associated with the second information-storage element and driven by the first information-storage element, for selectively enabling the programming of the second information-storage element depending on the state of the first information-storage element.

BRIEF DESCRIPTION OF THE DRAWINGS

The features and advantages of the present invention will be made evident by the following detailed description of an embodiment thereof, provided merely by way of non-limitative example, that will be made making reference to the attached drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
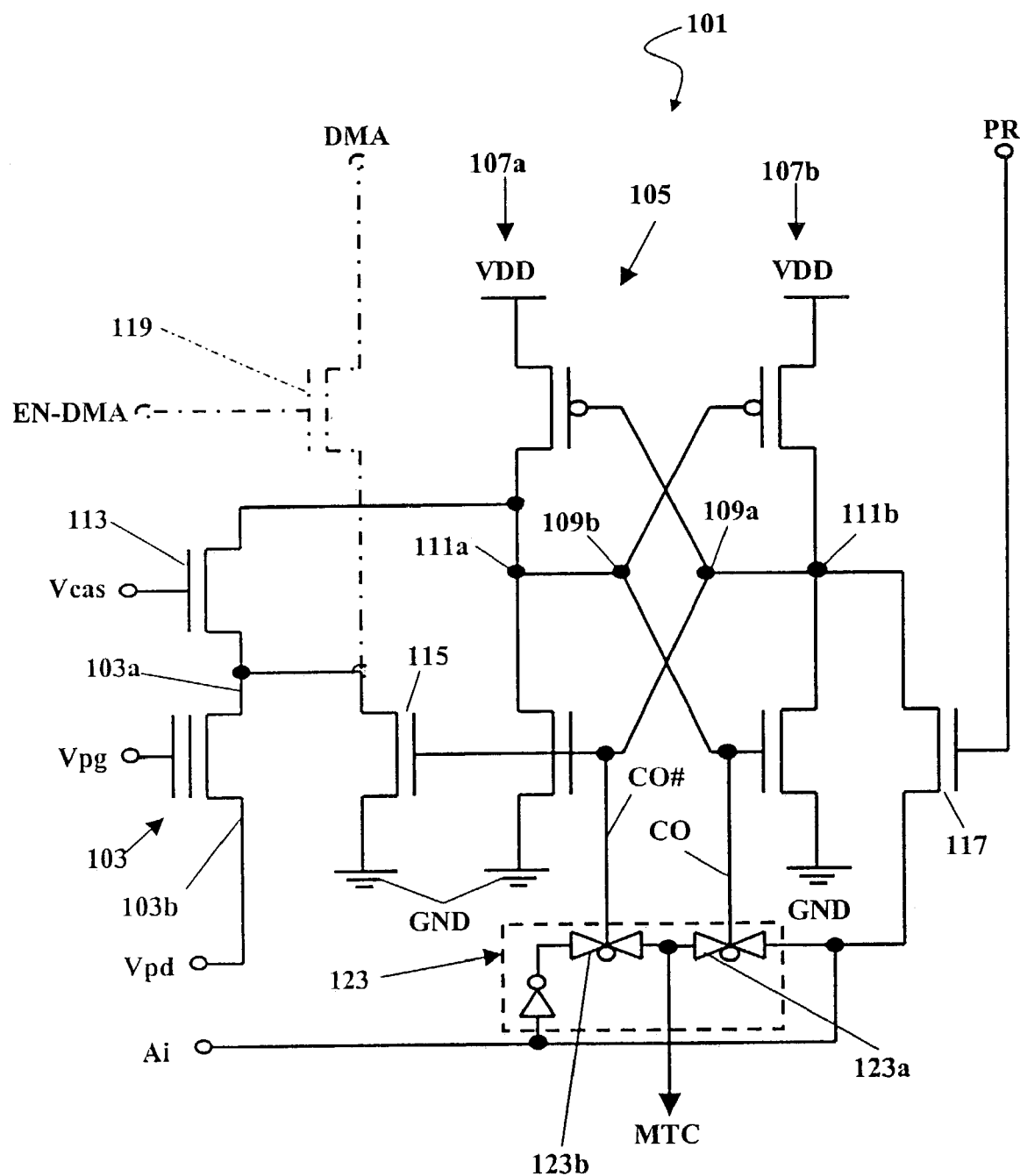
FIG. 1 is a circuit diagram of a non-volatile latch circuit according to an embodiment of the present invention.

With reference to the drawings, a non-volatile latch circuit according to an embodiment of the present invention is shown in FIG. 1. The non-volatile latch circuit, globally identified by 101, comprises a non-volatile storage element 103 and a volatile storage element 105. By non-volatile and volatile, there is intended the capability or, respectively, incapability of the storage element to retain the stored information in absence of electric supply.

The non-volatile storage element 103 can be, for instance, a floating-gate MOS transistor, of the type commonly used to form a memory cell in EPROMs or flash memories. As known, in this type of non-volatile storage element, the information is stored in terms of the presence or absence of an electric charge on the floating gate, where the charge can be injected by means of the mechanism of injection of hot electrons that are originated by a programming current flowing through the transistor. Preferably, the non-volatile storage element 103 is of the electrically erasable type, such as the memory cells of the flash memories. Alternatively, the non-volatile storage element 103 is a MOS transistor with, instead of the floating gate, a charge-trapping layer, for instance, a layer of silicon nitride, interposed between the transistor channel region and the gate. The non-volatile storage element 103 can also be of the type capable of storing two bits in two separate charge-trapping locations. As described in the following, the structure of the non-volatile latch circuit is such as to be capable of also supporting this type of non-volatile storage element in which, as known, the electric terminals change the roles of source electrode and drain electrode depending on the operating mode (read and erase or program).

The volatile storage element 105 is a latch comprising a pair of CMOS inverters 107a, 107b cross-connected to each other. The inverter 107a has an input 109a connected to an output 111b of the inverter 107b, and an output 111a connected to an input 109b of the inverter 107b. The volatile storage element 105 has two complementary output lines CO, CO#, on which the logic state contained in the volatile storage element 105 is made available.

The non-volatile storage element 103 has a first electrode 103a that, through an N-channel MOSFET 113, is coupled to the output 111a of the inverter 107a, and thus to the output line CO of the volatile storage element 105. The MOSFET 113 has a drain electrode connected to the output 111a of the inverter 107a, a source electrode connected to the first electrode 103a of the non-volatile storage element 103, and a gate electrode connected to a voltage line Vcas switchable between a turn-off voltage, adapted to turn the MOSFET 113 off, and a turn-on voltage, adapted to turn the MOSFET 113 on. The MOSFET 113 acts as a selective connection element, adapted to selectively connect the non-volatile storage element 103 to the volatile storage element 105; additionally, by properly choosing the value of the turn-on voltage, the MOSFET 113 allows limiting the voltage of the electrode 103a when the non-volatile storage element 103 is electrically connected to the volatile storage element 105.

A second electrode 103b of the non-volatile storage element 103 is connected to a voltage line Vpd, through which it is possible to deliver a programming voltage (for instance, equal to approximately 5 V), an erase voltage (for instance, equal to approximately 8 V) or a read voltage (equal to the ground), respectively for programming, erasing, and reading the non-volatile storage element 103. A control electrode (gate) of the non-volatile storage element 103 is connected to a gate voltage line Vpg, through which it is possible to deliver a read gate voltage (for instance, equal to approximately 3.5 V), a program gate voltage (for instance, equal to approximately 9 V) and a turn-off/erase gate voltage (equal to the ground).

In addition to the non-volatile storage element 103 and to the volatile storage element 105, the non-volatile latch circuit 101 also includes an element 115 for enabling the programming of the non-volatile storage element 103, adapted to selectively connect the first electrode 103a of the non-volatile storage element 103 to the ground GND (in general, to a reference voltage), and an access element 117 for setting the volatile storage element 105.

In the shown embodiment, the element 115 is formed of an N-channel MOSFET, acting as a switch, with a source electrode connected to the ground GND, a drain electrode connected to the first electrode 103a of the non-volatile storage element 103 and a gate electrode connected to the output 111b of the inverter 107b, and thus to the output line CO# of the volatile storage element 105. The turning on of the MOSFET 115 is therefore determined by a prescribed state being stored in the volatile storage element 105, particularly the state CO#="1".

Still referring to the shown embodiment, the setting element 117 is formed of an N-channel MOSFET, acting as a pass transistor, having an electrode connected to the input 109a of the inverter 107a, an electrode connected to a digital signal line Ai carrying a digital signal corresponding to a logic state that is desired to be set in the volatile storage element 105, and a gate electrode connected to a digital signal line PR for enabling the setting operation of the volatile storage element 105.

In a preferred embodiment, the non-volatile latch circuit 101 includes a direct-access circuit path (in jargon, and in the following, "DMA") to the non-volatile storage element 103, selectively activatable for allowing a direct access to the non-volatile storage element 103 from the outside, with the purpose of verifying and characterizing the non-volatile storage element 103. Particularly, in the shown example, the DMA path includes an N-channel MOSFET 119 having a first electrode connected to the first electrode 103a of the non-volatile storage element 103, a second electrode connected to a direct-access line DMA corresponding to the non-volatile storage element 103, and a gate electrode connected to a digital signal line EN-DMA for enabling the DMA path.

In other words, in the non-volatile latch circuit 101, four different paths can be identified: a set path of the volatile storage element 105, comprising the MOSFET 117, a programming path of the non-volatile storage element 103, comprising the MOSFET 115, a read path of the non-volatile storage element 103, comprising the MOSFET 113, and a direct access path from the outside, comprising the MOSFET 119. It is additionally pointed out that the non-volatile storage element 103 can be disconnected from the volatile storage element 105, and the programming path is selectively activatable depending on the state of the volatile storage element 105, wherein the state can, in turn, be set through the set path.

In the exemplary embodiment discussed herein, the storage unit 101 is employed for storing a prescribed logic state chosen between the two logic states that can appear on the signal line Ai, so that such prescribed logic state can then be compared to the current logic state on the signal line Ai, for detecting the coincidence of the two logic states. The storage unit 101 includes, therefore, a comparator circuit, globally identified as 123, that asserts a logic "1" on an output line MTC when the logic state on the signal line Ai coincides with the logic state stored in the volatile storage element 105. The comparator circuit 123 includes a pair of transfer gates 123a and 123b. The transfer gate 123a is closed when the logic state of the output line CO is a "1", while the transfer gate 123b is closed when the logic state of the output line CO is a "0". If the logic state on the signal line Ai coincides with the logic state of the output line CO, then the logic state of the output line MTC, forming a signal indicative of coincidence, is a "1".

This use of the storage unit 101 is typical of the circuitries that implement the redundancy in semiconductor memories. During the testing phase of the memory, the addresses that correspond to defective memory locations are identified, and such addresses are stored in specifically designed redundancy registers, each of which is operatively associated with a respective redundancy location. During the normal operation of the memory, the current address furnished to the memory is compared to each of the addresses stored in the redundancy registers and, in case of coincidence, a redundancy location is accessed instead of the defective memory location: the accessed redundancy location is the redundancy location that is associated with the redundancy register that stores the address that coincides with the current address.

Figure 2A:
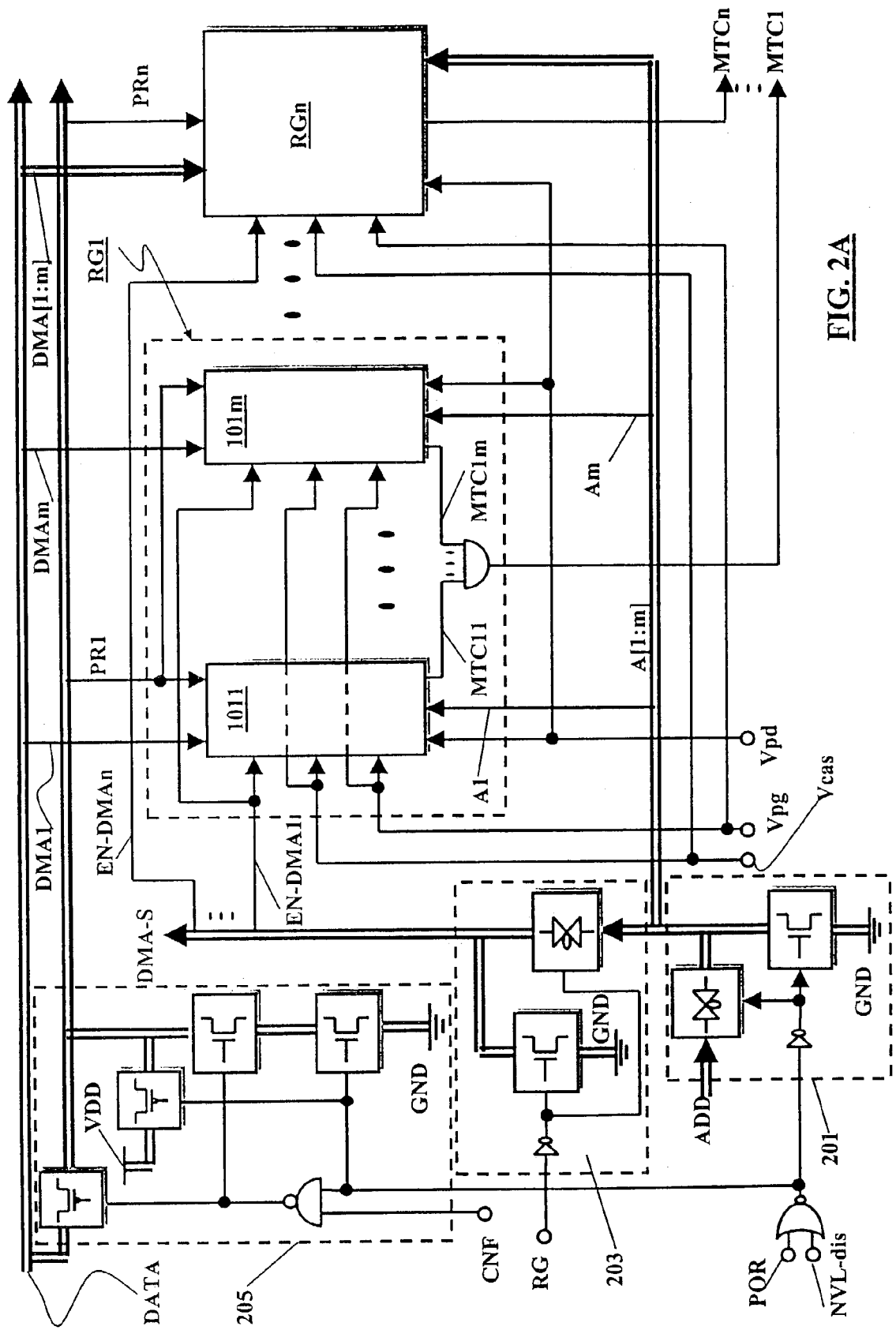
FIGS. 2A and 2B schematically show a plurality of registers made up of non-volatile latch circuits of the type shown in FIG. 1, particularly registers of a redundancy circuitry of a semiconductor memory according to an embodiment of the invention.
Figure 2B:
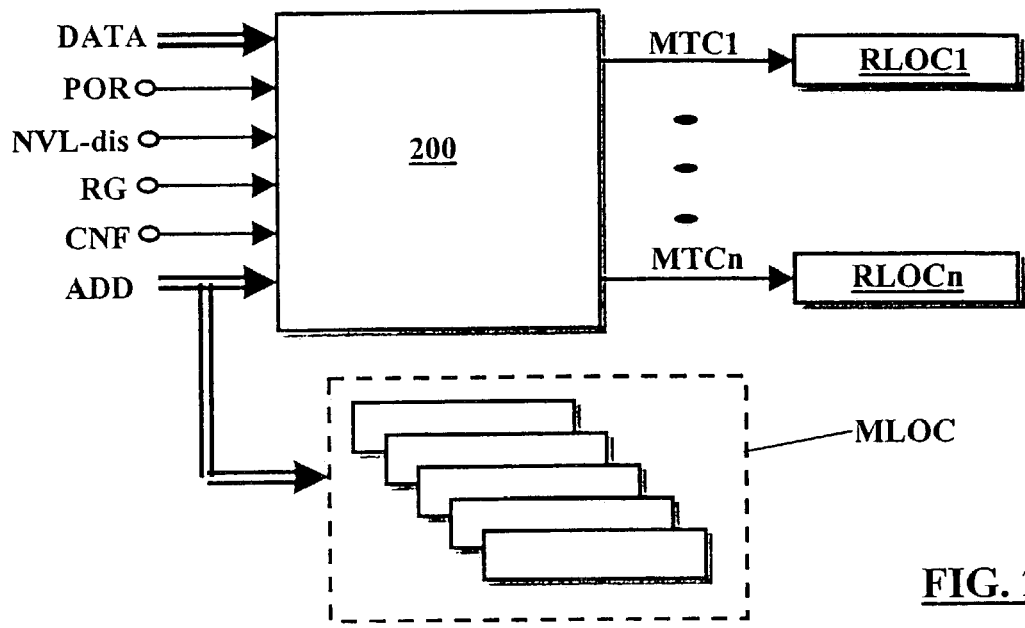

As shown in FIG. 2A, the circuit 101 of FIG. 1 is in such a case one of m identical circuits 101₁–101m of one of n redundancy registers RG1–RGn making up a redundancy circuitry, globally identified by 200 in FIG. 2B; the signal line Ai is one of m signal lines A1–Am, forming altogether a bus A[1:m] adapted to furnish the memory address signals to the registers RG1–RGn. FIG. 2A also shows a preferred embodiment of the redundancy circuitry, that exploits in a peculiar way signal lines normally provided in a memory, and particularly an address bus ADD and a data bus DATA internal to the memory.

Specifically, the bus A[1:m] (in the following, concisely, local address bus) is local to the redundancy circuitry, and it is derived from a main address signal bus (in the following, for brevity, main address bus) ADD of the memory; typically, the main address bus ADD receives address signals provided to the memory from the outside, and feeds memory location selection circuits. In the normal operation of the memory, the local address bus A[1:m] is connected to the main address bus ADD. In predetermined operation modes of the memory and, in general (as will appear in the following), whenever it is necessary to reset the volatile storage elements 105 of the different registers RG1–RGn, a decoupling circuit 201 allows disconnecting the local address bus A[1:m] from the main address bus ADD, and connecting the lines of the bus A[1:m] to the ground GND. Particularly, this takes place at the memory power-up, when a power-on reset signal POR is asserted to "1"; in the normal operation of the memory, the forced connection to the ground of the lines of the bus A[1:m] is determined by a control signal NVL-dis.

A bus DMA-S is further derived from the local address bus A[1:m]; the bus DMA-S is made of DMA-mode enable signals EN-DMA1–EN-DMAn: each of these signals, if asserted, determines the activation of the DMA mode of a respective register RG1–RGn, turning on the MOSFETs 119 of the storage units 101 of that register. In the normal operation of the memory, a coupling circuit 203 allows maintaining the bus DMA-S disconnected from the local address bus A[1:m], and keeping the signal lines EN-DMA1–EN-DMAn connected to ground; in the DMA mode, activated by asserting a signal RG, the circuit 203 allows connecting the lines of the bus DMA-S to respective lines of the local address bus A[1:m].

Depending on the operating mode of the memory, the lines of the data bus DATA of the memory are exploited both for bringing to the non-volatile latches 101₁–101m of the registers RG1–RGn enable signals PR1–PRn (one for each register) of the set mode of the respective volatile storage elements 105, and as access lines DMA1–DMAm to the non-volatile storage elements 103 of a register selected for the DMA. A circuit 205 allows isolating from the lines of the data bus DATA the set mode enable signal lines PR1–PRn upon assertion of the signal POR (i.e., at the memory power-up) or of the signal NVL-dis; the signal lines PR1–PRn are in this case connected to the supply voltage VDD (for instance, 5 V), forcing to "1" their logic state and thus turning on the transistors 117 of all the storage units 101₁–101m of all the registers. It is observed that, as mentioned previously, in these cases the lines of the local address bus A[1:m] are connected to the ground GND; particularly, when also the signal RG is asserted, the lines of the data bus DATA are left free to be used as lines of direct access to the non-volatile storage elements.

It will be noticed that, in the preceding description, it has been implicitly assumed that the number m of address signal lines is equal or greater than the number n of registers; a situation normally encountered in the commercially available memories. However, this is not to be considered a limitation because, in general, by properly modifying the circuits 201, 203 and 205, it is also possible to manage a number of registers higher than that of the available signal lines.

The operation of the storage unit 101 will now be discussed making reference to the time diagrams of the FIGS. 3A–3E.

Figure 3A:
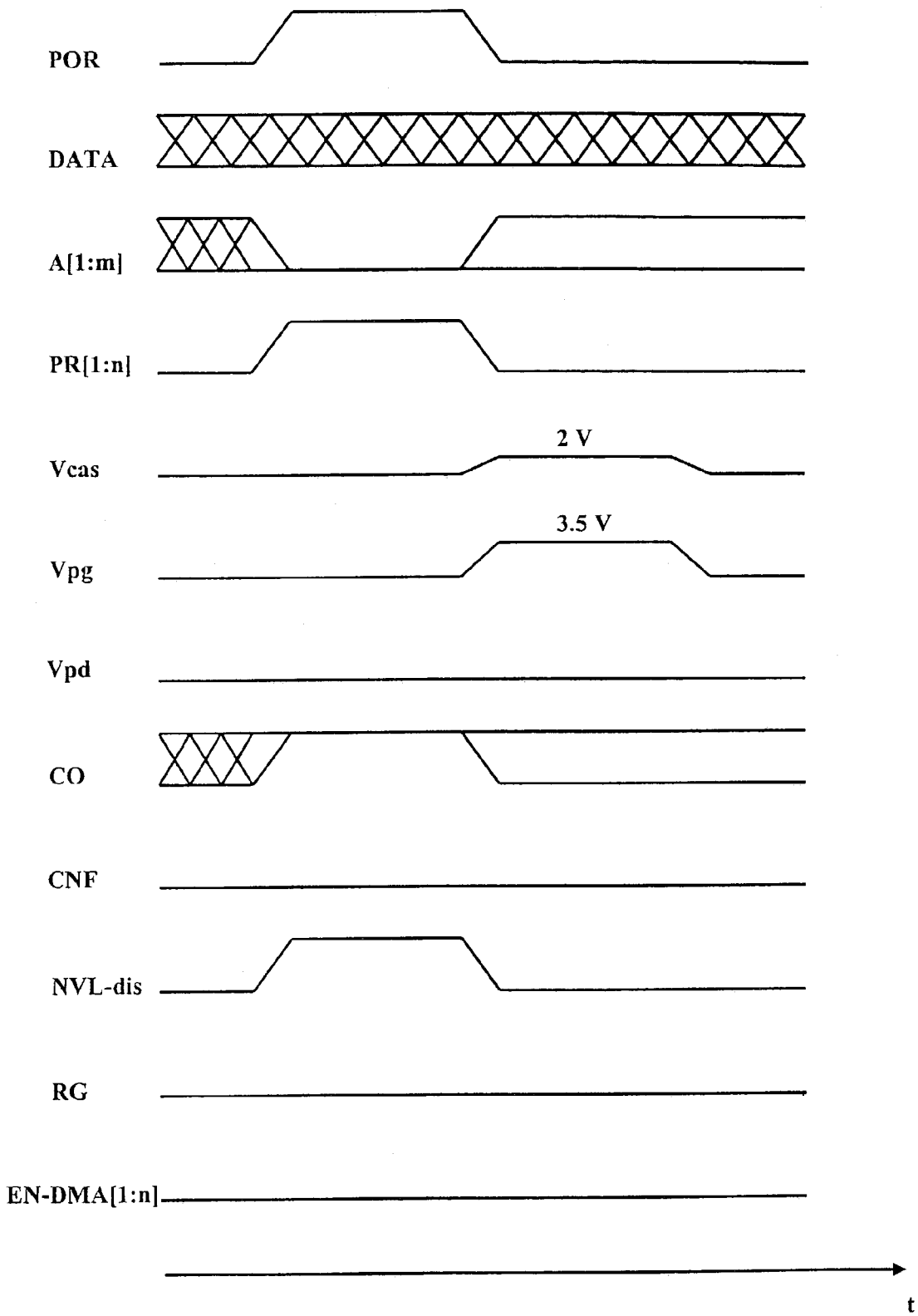
FIGS. 3A to 3E show timing diagrams illustrating the operation of the circuit of FIG. 2 according to an embodiment of the invention.

With reference to FIG. 3A, at the memory power-up the information stored in non-volatile way in the non-volatile storage elements 103 of the non-volatile latches 101₁–101m forming the plurality of registers RG1–RGn is read and loaded into the respective volatile storage elements 105. Specifically, this operation is carried out in two phases. In a first phase, all the volatile storage elements 105 are reset. A circuit (not shown in the drawings because known per-se) normally provided in the memory detects the memory power up (it does so by detecting the rise of the supply voltage VDD), and asserts the signal POR. The circuit 201 disconnects the local address bus A[1:m] from the main address bus ADD, and forces all the lines thereof to ground. At the same time, the circuit 205 disconnects the signal lines PR1–PRn from the respective lines of the data bus DATA (the state of the lines of the bus DATA is, therefore, irrelevant) and forces them to the voltage VDD, thus activating the MOSFETs 117 of all the non-volatile latches 101₁–101m in all the registers RG1–RGn. In this way, all the volatile storage elements 105 are brought into the state CO="1"; it is observed that in this state the MOSFETs 115 are off. In a second phase, after the signal POR has been deasserted, the information stored in the non-volatile storage elements 103 is read and loaded into the respective volatile storage elements 105. Particularly, the deassertion of the signal POR determines the connection of the bus A[1:m] to the bus ADD by the circuit 201; the signal lines PR1–PRn are forced to ground by the circuit 205, because an enable signal CNF enabling the configuration mode is kept deasserted to ground; the MOSFETs 117 are, therefore, off. The non-volatile storage elements 103 are then biased in read conditions: the line Vpg is brought to a voltage (read gate voltage) positive and sufficiently high to determine the turning on of the non-volatile storage elements 103 that are not programmed, for instance to 3.5 V, and the line Vpd (connected to the electrode 113b that, in reading, acts as a source of the non-volatile storage elements 103) is kept to ground. The non-volatile storage elements 103 are connected to the respective volatile storage elements 105 by turning the MOSFETs 113 on: to this purpose, the line Vcas is raised to a positive voltage, for instance, 2 V, enough to turn the MOSFETs 113 on, limiting at the same time the voltage on the electrode 113a of the non-volatile storage elements 103, so as to avoid spurious phenomena of "soft-programming". Under such conditions, if a non-volatile storage element 103 is programmed, no current flows therethrough, and the corresponding volatile storage element 105 remains in the state CO="1"; on the contrary, if the non-volatile storage element 103 is not programmed, the current flowing therethrough determines the switching of the respective volatile storage element 105, that is brought into the state CO="0". At the end of this phase, a state has been loaded into the volatile storage elements 105 that corresponds to the programmed or non-programmed state of the respective non-volatile storage elements 103; the lines Vpg and Vcas can be brought to ground, turning the non-volatile storage elements 103 off and isolating them from the respective volatile storage elements 105. The previous deassertion of the signal POR determines the connection of the bus A[1:m] to the bus ADD; however, this does not affect the configuration of the volatile storage elements 105, because the MOSFETs 117 are off. The registers RG1–RGn are now capable of performing the comparison between the current memory address present on the bus A[1:m] and the address stored therein, loaded in the respective volatile storage elements 105, activating a respective signal MTC1–MTCn indicative of the coincidence when such comparison gives a positive result. To such end, all the signals indicative of coincidence generated by the different storage units 1011–101m of a given register RG1–RGn, as, for instance, the signals MTC11–MTC1m shown in FIG. 2A, are inputs to a logical AND gate. The assertion of one of the signals indicative of coincidence MTC1–MTCn determines, as usual, the selection of a redundancy location RLOC1–RLOCn instead of the defective memory location addressed by the current address among all the memory locations MLOC (FIG. 2B).

During the operation, the signal RG is kept deasserted, so that the lines EN-DMA[1:n] of the bus DMA-S are forced to ground. The signal NVL-dis can indifferently be kept deasserted or be asserted together with the signal POR.

In alternative to what described above, the voltages on the lines Vpg and Vcas can be fed in pulsed way, rather than continuously.

Figure 3B:
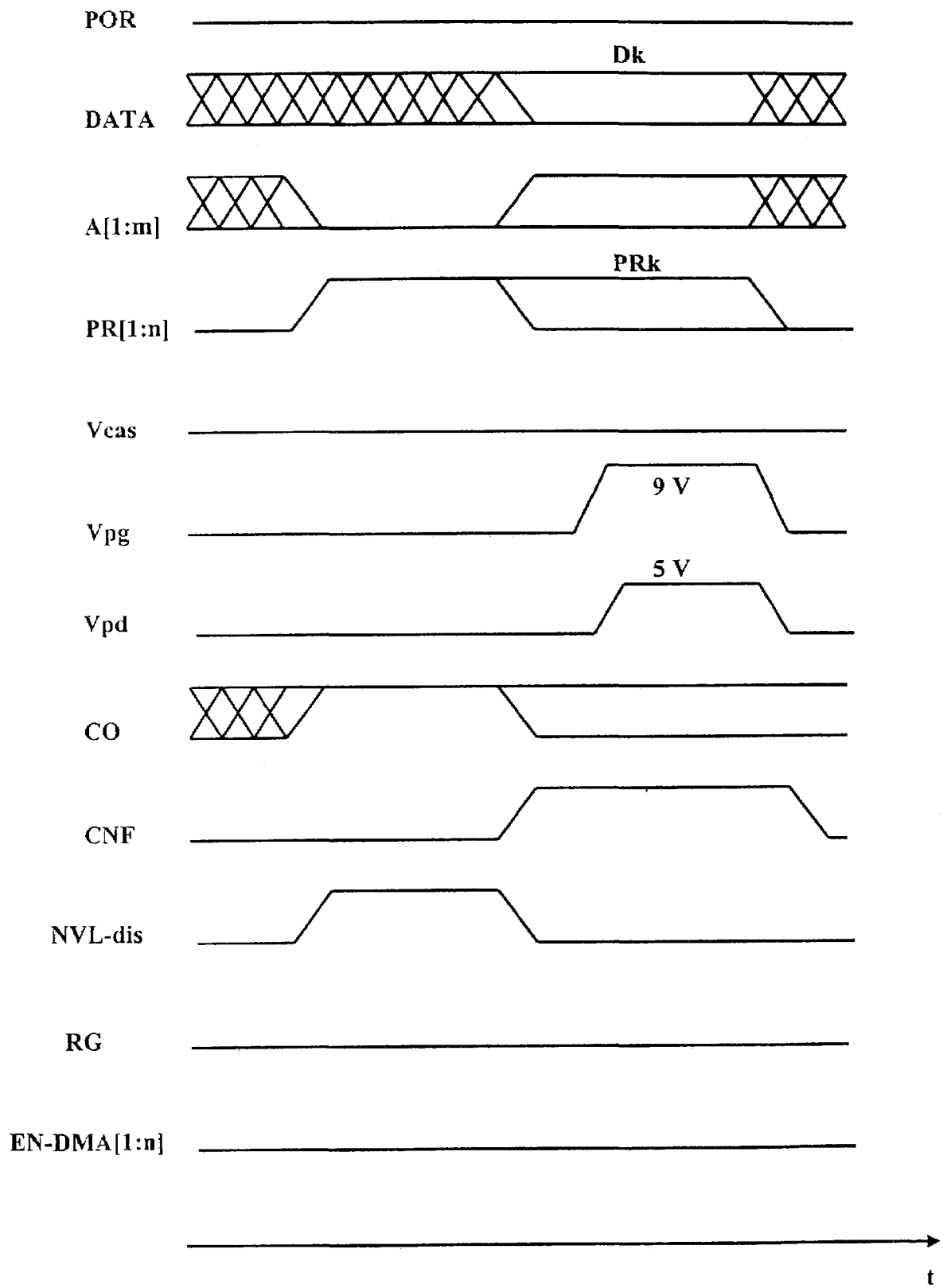

In FIG. 3B there is schematically shown the timing of a program operation of the non-volatile storage elements 103 of a generic register RG1–RGn. Such operation is composed of three phases: a first phase of reset of the volatile storage elements 105 of the non-volatile latches that constitute the register, a second phase of loading into the volatile storage elements 105 of the data to be programmed in the respective non-volatile storage elements 103, and a third phase of actual programming of the latter.

Particularly, the first phase is started by asserting the signal NVL-dis: in this way, as at the memory power-up, the lines of the bus A[1:m] are forced to ground, the lines PR1–PRn are forced to the voltage VDD and the MOSFETs 117 are turned on; all the volatile storage elements 105 of all the registers RG1–RGn are brought to the state CO="1".

Subsequently, the signal NVL-dis is deasserted, and the signal CNF is asserted: in this way, the lines PR1–PRn are connected to the respective lines of the bus DATA. Asserting a line Dk of the bus DATA, only the enable signal PRk that enables the setting of the selected register is kept to "1". The deassertion of the signal NVL-dis also determines the connection of the bus A[1:m] to the bus ADD, that carries the data word to be programmed into the selected register. In the volatile storage elements 105 of the selected register a logic state is, thus, loaded that depends on the state present on the respective lines of the bus A[1:m]: if the generic line Ai of the bus A[1:m] carries a "0" state, the corresponding volatile storage element 105 remains in the state CO="1", if instead the line Ai carries a state "1", the corresponding volatile storage element 105 is brought into the state CO="0".

In the third phase, the lines Vpg and Vpd are raised to respective programming voltages of the non-volatile elements; for instance, the line Vpg is raised to approximately 9 V, while the line Vpd is raised to approximately 5 V. The line Vcas is kept to ground, so as to keep the MOSFETs 113 off. Depending on the state loaded in the volatile storage element 105 in the preceding phase, the MOSFET 115 is off (CO="1") or on (CO="0"); if the MOSFET 115 is on, the electrode 103a of the respective non-volatile storage element 103 is connected to ground, and the non-volatile element can be programmed; if the MOSFET 115 is off, the non-volatile element is not programmed, because there is no current path toward ground for the programming current.

It is observed that the reset operation sets the volatile storage elements 105 in a state such that the programming of the respective non-volatile storage elements 103 is inhibited (the MOSFETs 115 are off); therefore, in the following programming phase, only the non-volatile storage elements 103 associated with the volatile storage elements 105 of the selected register in which, in the second phase of the operation, a "0" state has been loaded are programmed; the non-volatile storage elements 103 of the other registers are not affected by the programming. Unintentional or spurious alterations of the information stored in the non-volatile storage elements of the non-selected registers are thus avoided.

It is also observed that the generic non-volatile storage element 103 is programmed applying the programming voltage to the electrode 103b that, in programming, acts as a drain electrode of the transistor, and that in reading acts instead as a source electrode. While this is irrelevant in the case of use, as non-volatile storage element, of a floating-gate MOS transistor, the inversion of source/drain function of the electrodes 103a and 103b is essential in the case of use of a MOS transistor with a layer of nitride and dual charge-trapping locations.

Although, in the example shown in FIG. 3B, the lines of the local address bus A[1:m] are connected to the lines of the main address bus ADD also during the third phase of the programming operation, this is not strictly necessary: the signal PRk can be deasserted and the lines of the local address bus can be disconnected from the lines of the main address bus at the end of the second phase, before the start of the actual programming phase of the non-volatile storage elements; for the programming of the non-volatile storage elements it is not, in fact, necessary to keep the data word to be programmed on the lines of the local address bus.

The programming operation of more than one register is also composed of the three phases of resetting the registers, loading the data to be programmed into the volatile storage elements and programming the non-volatile storage elements. Advantageously, instead of repeating the three phases for every register to program, in the phase of loading of the data words to be programmed different lines of the bus DATA, and, therefore, different lines PR1–PRn, are asserted in time succession, corresponding to the different registers to be programmed; the registers to be programmed are, thus, enabled to the loading of the data furnished through the bus A[1:m] in time succession. The following programming phase, unique for all the registers, will determine the programming of the non-volatile storage elements associated with the volatile storage elements in the different registers in which, in the preceding phase, the state CO="0" has been loaded.

Figure 3C:
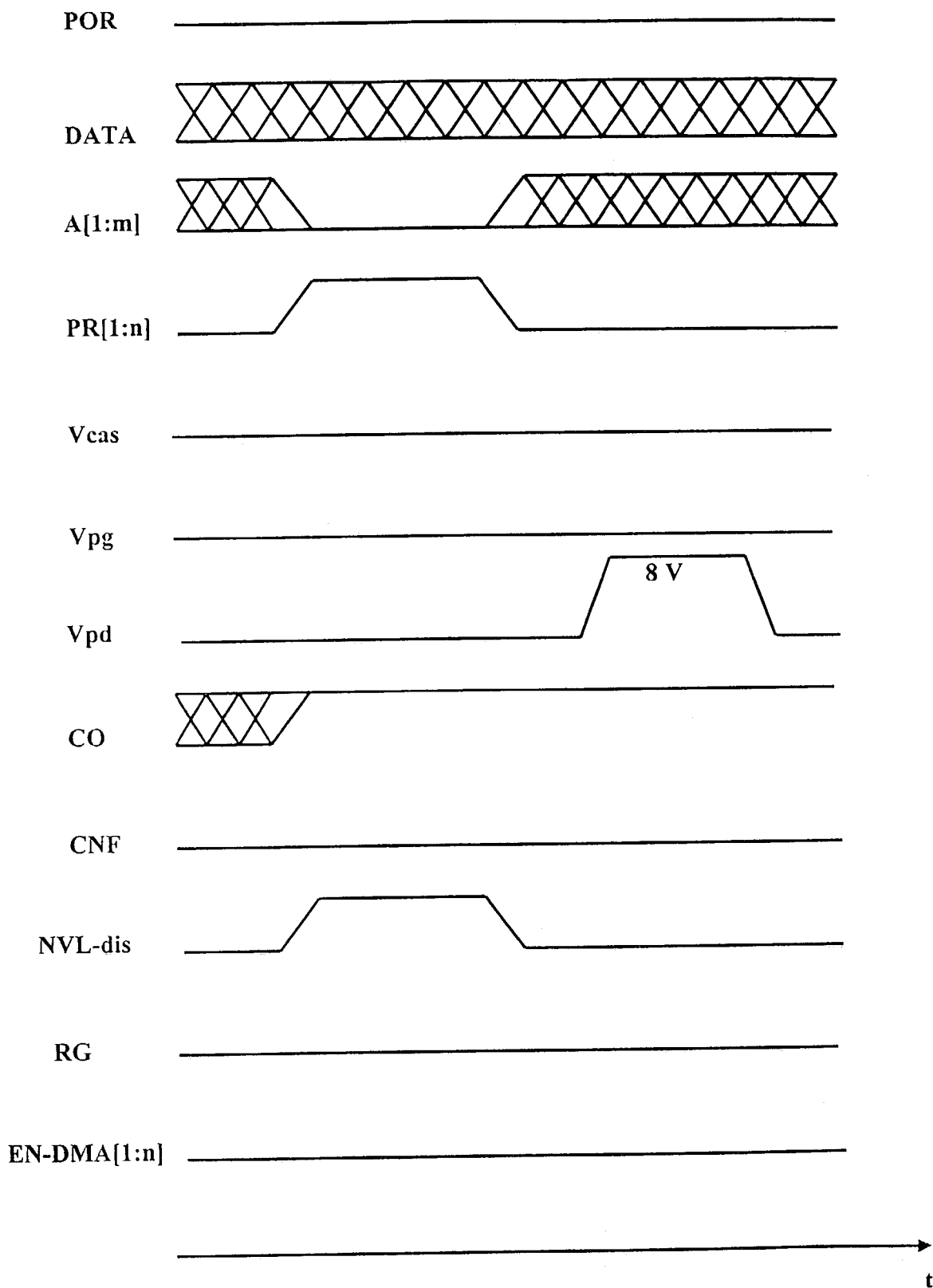

The non-volatile storage elements of the several non-volatile latches 1011–101m of the registers RG1-RGn can also be erased; in FIG. 3C the timing of the erase operation is schematically shown. The operation is composed of a phase of reset of the volatile elements of all the registers, started as in the programming operation by asserting the signal NVL-dis. At the end of this phase, all the volatile storage elements 105 of the different registers are in the state CO="1"; all the MOSFETs 115 are, therefore, off, and the electrodes 103a of the non-volatile storage elements 103 are floating. In the following phase, after the deassertion of the signal NVL-dis, the line Vpd is raised to a relatively high positive voltage, for instance, 8 V, while the line Vpg is kept to ground. In such conditions, the non-volatile storage elements 103 are erased. Alternatively, the line Vpg can be brought to a negative voltage and the line Vpd can be raised to a lower positive potential.

The MOSFET 119, where provided, allows performing operations of direct access to the non-volatile storage elements 103 of the different registers.

Figure 3D:
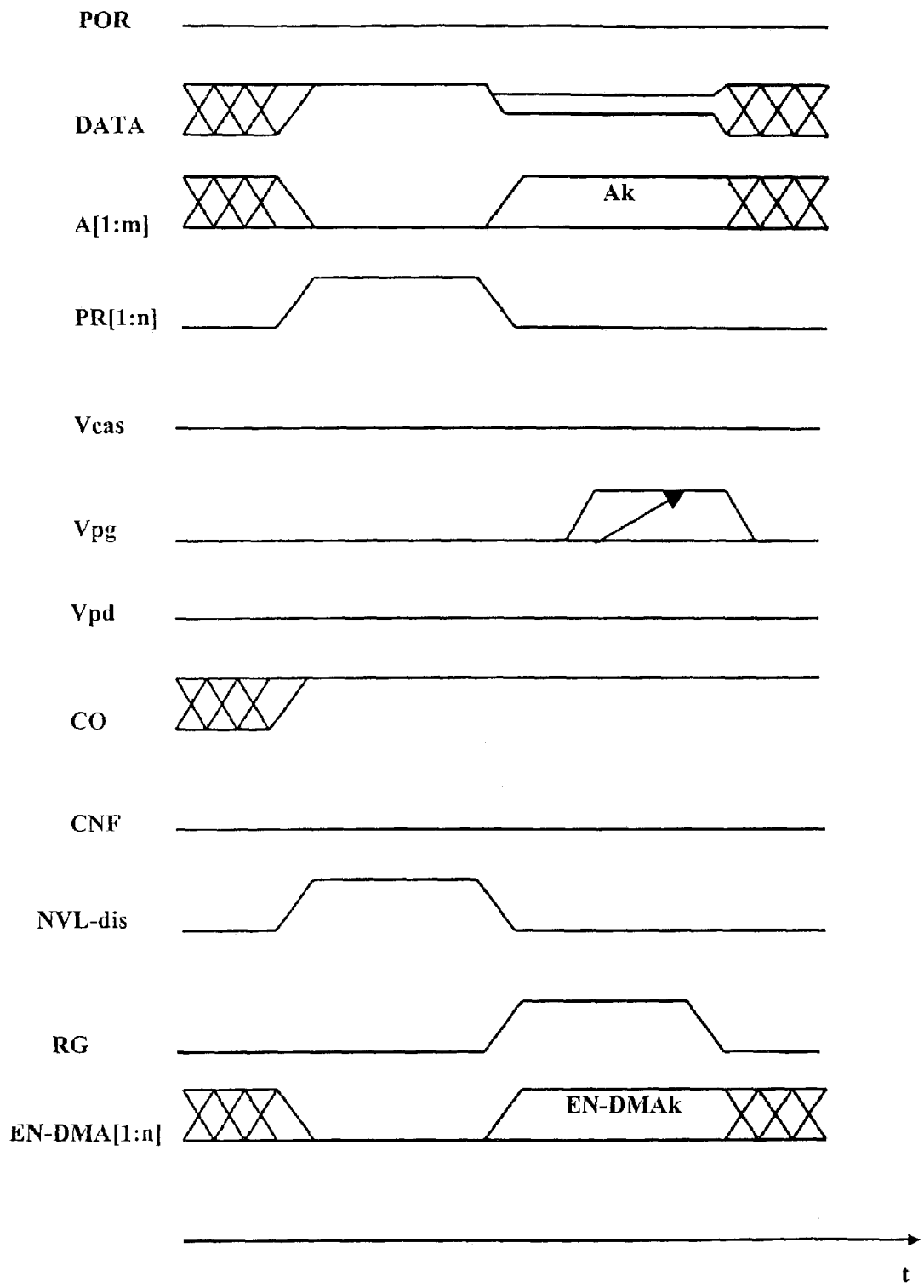

A first direct-access operation has the timing schematically shown in FIG. 3D. This operation allows, with the purpose characterization, accessing the non-volatile storage elements 103 of a selected register, forcing a current to flow therethrough and measuring the corresponding voltage on the electrode 103a. The operation includes an initial phase of reset of all the registers, started by asserting the signal NVL-dis. At the end of this phase, that is not followed by a read of the information stored in the non-volatile storage elements (the line Vcas is kept to ground) the signal RG furnished to the circuit 203 is asserted, so as to cause the connection of the bus DMA-S to the bus A[1:m], in turn connected to the bus ADD. By asserting one of the lines of the bus ADD, for instance, the line Ak, it is, thus, possible to assert one of the lines EN-DMA1–EN-DMAn of the bus DMA-S, for instance, the line EN-DMAk, thus, enabling the direct access path to the non-volatile storage elements 103 of the selected register; the MOSFETs 119 of the non-volatile latches 1011–101m of the selected register are turned on. The electrode 103a of the non-volatile storage elements is, thus, connected to the respective line DMA (it is observed that the MOSFET 115 is off), and, therefore, accessible from the outside of the memory. Each of the lines of the bus DATA acts as an access line DMA1–DMAm for a respective non-volatile latch of the selected register. The voltage of the line Vpg is then made to vary and, forcing a prescribed current on the lines of the bus DATA, the voltage of the electrodes 103a of the non-volatile storage elements of the selected register, present on the lines of the bus DATA, is measured.

Figure 3E:
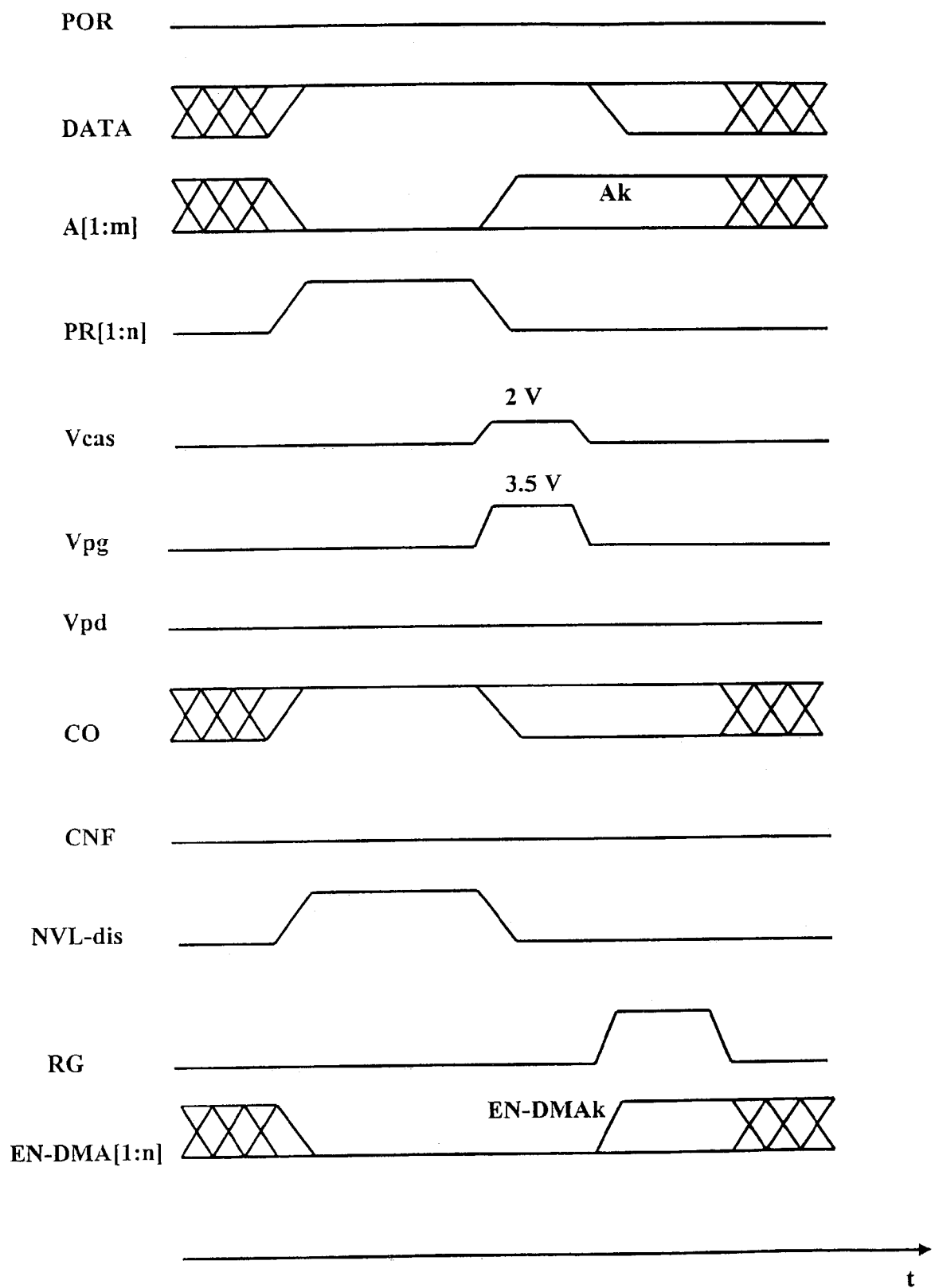

A second direct-access operation has the timing schematically shown in FIG. 3E. This operation allows verifying, directly from outside the memory, the programming state of the non-volatile storage elements 103 of a selected register, and checking whether the MOSFETs 115 are turned on or off. The operation includes an initial phase of reset of all the registers, started asserting the signal NVL-dis. Subsequently, and for all the registers, the information stored in the non-volatile storage elements 103 is read and loaded into the respective volatile storage elements 105; this is carried out, as at the memory power-up, bringing the lines Vcas and Vpg to 2 V and 3.5 V, respectively, for a relatively limited period of time. In this phase, the state of the volatile storage elements 105, that in the phase of reset had been set to CO="1", switches depending on the information stored in the respective non-volatile storage element 103. At the end of this phase, the signal RG is asserted, so as to cause the connection of the bus DMA-S to the bus A[1:m], which is in turn connected to the bus ADD. By asserting one of the lines of the bus ADD, for instance, the line Ak, one of the lines EN-DMA1–EN-DMAn of the bus DMA-S is asserted, for instance, the line EN-DMAk, turning on the MOSFETs 119 of the non-volatile latches 1011–101m of the selected register. The MOSFETs 115 of the non-volatile latches 1011–101m of the selected register are turned on or off depending on the state of the respective volatile storage element (CO="1": MOSFET 115 off, CO="0": MOSFET 115 on). The lines of the bus DATA, through which a predetermined current is forced, are accordingly brought to different voltage levels depending on the state of the MOSFETs 115, and particularly to "1" if the respective MOSFET 115 is off (programmed non-volatile storage element) or to "0" if the respective MOSFET 115 is on (non-programmed non-volatile storage element). The state of each non-volatile latch of the selected register is thus made available on the lines of the bus DATA.

It is also possible to detect from the outside the state of all the registers in time sequence, asserting in sequence the different lines of the bus ADD after the phase of reset and the phase of loading of the data.

The redundancy registers RG1–RGn can also be exploited as support registers for the temporary storage of data. Through an operation consisting of the first two phases of the programming operation previously described, it is, in fact, possible to load data into one or more of the registers RG1–RGn. The functionality of the registers within the redundancy circuitry is not jeopardized, because the addresses of the defective locations, stored in non-volatile way in the non-volatile storage elements 103, can be recovered at any time, through a read operation similar to that performed at the memory power-up (in this case, the operation will be started asserting the signal NVL-dis, rather than the signal POR). The non-volatile latch circuit 101 is, therefore, very versatile.

Figure 4:
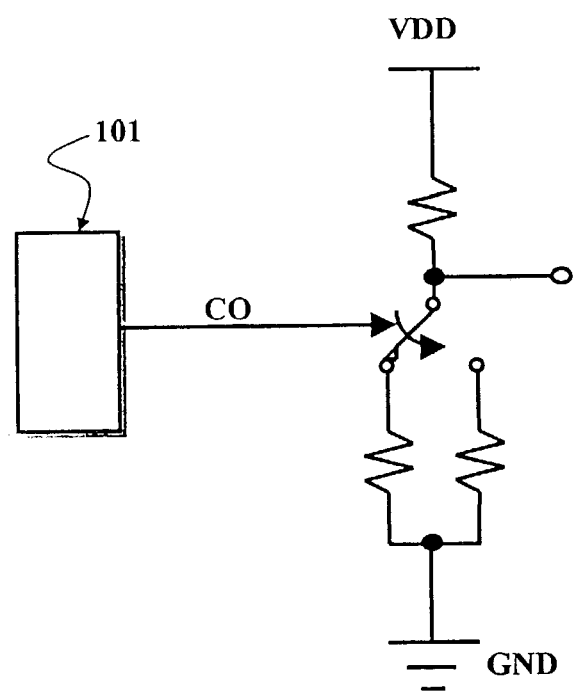
FIG. 4 shows in is a schematic diagram that shows the use of a non-volatile latch according to an embodiment of the present invention for storing a selected configuration of a configurable circuit structure.

The application described above is not the only one conceivable; another possible application of the non-volatile latch 101, shown in a schematic way in FIG. 4, consists in the realization of configuration registers of generic configurable circuit structures, for instance, voltage or current dividers, arrays of switches and the like, often used in integrated circuits for allowing a fine and/or a post-manufacture trimming of circuit parameters. In such case, the comparison circuit 123 is not necessary and can be replaced by a simple drive stage (for instance, an inverter) that decouples and properly strengthens the signal on the output line CO (or, indifferently, the output line CO#).

The non-volatile latch circuit 101 is adapted to be used as a non-volatile storage element both of a floating-gate MOS transistor, of the type normally used for realizing EPROM or flash memory cells, and of a MOS transistor with a charge-trapping layer in which the charge can be stored in two separate locations. Particularly, using this second type of non-volatile storage element, the structure of the non-volatile latch 101 is adapted to manage in a corrected way the inversion of function of source electrode and drain electrode in the two modes of programming and reading of the non-volatile storage element: in programming, the electrode 103a acts as a source and the electrode 103b acts as a drain, while the opposite happens in reading.

It is possible to appreciate that the non-volatile latch circuit does not need particular circuitry for the programming of the non-volatile storage element, exception made for the program enable element 115 that, as in the shown example, can be constituted by a simple MOSFET.

Several changes to the embodiment herein described are possible, all within the reach of the average skilled technician.

Particularly, the N-channel MOSFETs 115, 117 and 119 could be replaced by P-channel MOSFETs, by transfer gates, by other types of transistor, and in general by any circuit component adapted to operate as a switch. The volatile storage element 105 could have a different circuit structure, it could be for instance a master-slave flip-flop. The comparison circuit 123 can clearly be realized in alternative ways to what shown.

Other variations to the described embodiment, and embodiments are conceivable, without for this departing from the scope of protection defined in the following claims. For example, the latch circuit 101 of FIGS. 1, 2A, and 2B can be included within an integrated circuit such as a memory or a processor, and the integrated circuit can be included in an electronic system such as a computer system.

What is claimed is:

1. A non-volatile latch circuit, comprising:
a first, volatile information-storage element;
a second, non-volatile information-storage element electrically programmable, associated with the first information-storage element;
first circuit means activatable for operatively coupling the second information-storage element to the first information-storage element, the first circuit means being activated for loading into the first information-storage element an information stored in the second information-storage element,
second circuit means associated with the first information-storage element for programming the first information-storage element in a select state;
third circuit means associated with the second information-storage element and driven by the first information-storage element for selectively enabling the programming of the second information-storage element depending on the state of the first information-storage element.

2. The non-volatile latch circuit according to claim 1, further comprising fourth circuit means for directly accessing the second information-storage element from outside the non-volatile latch.

3. The non-volatile latch circuit according to claim 1, in which the second information-storage element includes a first electrode and a second electrode, the first electrode being selectively couplable to the first information-storage element or to a first programming potential through the first and the third circuit means, respectively, the second electrode being adapted to receiving a second programming potential or a read potential.

4. The non-volatile latch circuit according to claim 1, in which the second information-storage element includes a floating-gate MOS transistor.

5. The non-volatile latch circuit according to claim 1, in which the second information-storage element includes a MOS transistor in which the first electrode and the second electrode exchange the function of source electrode and drain electrode in the operations of reading and programming of the transistor.

6. The non-volatile latch circuit according to claim 4, in which the first and the third circuit means are adapted to leave the first electrode floating, and the second electrode is adapted to receive an erase potential of the non-volatile storage element.

7. A method of storing a binary information in the non-volatile latch circuit realized according to claim 1, characterized by comprising a phase of setting the first information-storage element in a state corresponding to the information to be stored, through said second circuit means.

8. The method according to claim 7 for storing the binary information in non-volatile way, further comprising a following phase of applying programming potentials to the second information-storage element, the third circuit means enabling or not enabling the programming of the second information-storage element depending on the state set in the first information-storage element.

9. The method according to claim 8, comprising furnishing to the first information-storage element the binary information to be stored only during said phase of setting the first information-storage element.

10. A register comprising a plurality of binary information storage units, characterized in that said information storage units include non-volatile latch circuits according to claim 1.

11. A redundancy circuit for a semiconductor memory, comprising a plurality of registers each one adapted to store an address of a defective memory location to be functionally replaced by a redundancy memory location associated with the register, characterized in that the registers are realized according claim 10.

12. A semiconductor memory comprising the redundancy circuit realized according to claim 11.

13. The memory according to claim 12, in which:
a first selective-connection circuit allows selectively connecting lines of an address bus of the memory to the second circuit means of the non-volatile latches of the registers, so as to exploit the lines of the address bus for bringing a data word intended for setting in each register;
a second selective-connection circuit allows selectively connecting lines of a data bus of the memory to command lines of the second circuit means of the non-volatile latches of the registers, so as to exploit the lines of the data bus for selectively commanding the activation of the second circuit means for each register.

14. An integrated circuit comprising a configurable circuit structure and a control circuit of the configurable circuit structure, said control circuit comprising at least one register for storing a selected configuration for the configurable circuit structure, characterized in that said register is realized according to claim 10.

15. A memory cell, comprising:
a volatile circuit operable to store first data;
a nonvolatile circuit operable to store second data;
an inverter coupled between the volatile circuit and the nonvolatile circuit and operable to program the nonvolatile circuit with the first data; and wherein the nonvolatile circuit is operable to program the volatile circuit with the second data.

16. The memory cell of claim 15 wherein the volatile circuit is operable to receive the first data from a source other than the nonvolatile circuit.

17. The memory cell of claim 15 wherein the volatile circuit comprises a pair of cross coupled inverters.

18. The memory cell of claim 15 wherein the nonvolatile circuit is operable to store a single data bit.

19. The memory cell of claim 15 wherein the nonvolatile circuit is operable to store multiple bits of data.

20. An integrated circuit, comprising:
a memory cell, comprising,
a volatile circuit operable to store first data,
a nonvolatile circuit operable to store second data,
an inverter coupled between the volatile circuit and the nonvolatile circuit and operable to program the nonvolatile circuit with the first data, and
wherein the nonvolatile circuit is operable to program the volatile circuit with the second data.

21. An electronic system, comprising:
an integrated circuit, comprising,
a memory cell, comprising,
a volatile circuit operable to store first data,
a nonvolatile circuit operable to store second data,
an inverter coupled between the volatile circuit and the nonvolatile circuit and operable to program the nonvolatile circuit with the first data, and
wherein the nonvolatile circuit is operable to program the volatile circuit with the second data.

22. The memory cell of claim 15 wherein the inverter is coupled between the nonvolatile circuit and a first node of the volatile circuit, and a transistor is coupled between the nonvolatile circuit and a second node of the volatile circuit.

23. The memory cell of claim 15 wherein the inverter comprises a transistor having a control node coupled to the volatile circuit and an output node coupled to the nonvolatile circuit.

* * * * *